United States Patent
Tang et al.

(10) Patent No.: US 9,406,544 B1
(45) Date of Patent: Aug. 2, 2016

(54) SYSTEMS AND METHODS FOR ELIMINATING SEAMS IN ATOMIC LAYER DEPOSITION OF SILICON DIOXIDE FILM IN GAP FILL APPLICATIONS

(71) Applicant: LAM RESEARCH CORPORATION, Fremont, CA (US)

(72) Inventors: Wei Tang, Fremont, CA (US); Jason Daejin Park, San Jose, CA (US); Bart Van Schravendijk, Sunnyvale, CA (US); Kaihan Ashtiani, Cupertino, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 0 days.

(21) Appl. No.: 14/737,760

(22) Filed: Jun. 12, 2015

(51) Int. Cl.
| | |
|---|---|
| *H01L 21/76* | (2006.01) |
| *H01L 21/762* | (2006.01) |
| *H01L 21/02* | (2006.01) |
| *H01L 21/324* | (2006.01) |
| *H01L 29/06* | (2006.01) |

(52) U.S. Cl.
CPC ...... *H01L 21/76205* (2013.01); *H01L 21/0228* (2013.01); *H01L 21/02164* (2013.01); *H01L 21/02271* (2013.01); *H01L 21/324* (2013.01); *H01L 21/76224* (2013.01); *H01L 29/0649* (2013.01)

(58) Field of Classification Search
None
See application file for complete search history.

(56) References Cited

U.S. PATENT DOCUMENTS

| | | | |
|---|---|---|---|
| 8,728,955 B2 | 5/2014 | LaVoie et al. | |
| 2002/0127818 A1* | 9/2002 | Lee | H01L 21/76224 438/424 |
| 2005/0186755 A1* | 8/2005 | Smythe, III | H01L 21/76224 438/424 |
| 2005/0266655 A1* | 12/2005 | Nemani | H01L 21/76229 438/435 |
| 2009/0104789 A1* | 4/2009 | Mallick | C23C 16/045 438/788 |
| 2009/0269569 A1* | 10/2009 | Fucsko | H01L 21/316 428/220 |
| 2012/0256264 A1* | 10/2012 | Haneda | H01L 21/823807 257/368 |
| 2015/0014807 A1* | 1/2015 | Chuang | H01L 29/0649 257/506 |
| 2015/0102456 A1* | 4/2015 | Lin | H01L 21/31055 257/523 |

* cited by examiner

*Primary Examiner* — Angel Roman

(57) ABSTRACT

A method for filling a trench in a substrate includes partially filling the trench with a first silicon dioxide layer. An amorphous silicon layer is deposited on the silicon dioxide layer. The trench is filled with a second silicon dioxide layer. An oxidation treatment is performed on the substrate to oxidize the amorphous silicon layer.

16 Claims, 3 Drawing Sheets

SYSTEMS AND METHODS FOR ELIMINATING SEAMS IN ATOMIC LAYER DEPOSITION OF SILICON DIOXIDE FILM IN GAP FILL APPLICATIONS

FIELD

The present disclosure relates to substrate processing systems, and more particularly to systems and methods for eliminating seams during atomic layer deposition of silicon dioxide in gap fill applications.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Shallow trench insulators (STI) provide electrical isolation between individual transistor devices in integrated circuits (ICs). STIs usually include trenches that are filled with high quality silicon dioxide ($SiO_2$) film. In some examples, an aspect ratio (AR) of the trench can be as high as 8:1 and an opening of the trench narrows down to 20 nm. Void free STI gap fill during processing is important because the substrate may be subjected to a wet chemical process during subsequent integration steps.

Conventionally, STIs are filled using a high density plasma chemical vapor deposition (HDPCVD) process. For trenches with AR greater than about 4:1, the HDPCVD oxide is unable to fill the STIs without voids. Voids occur even when a cyclic deposition-etch-deposition process is used.

Alternative filling techniques such as sub-atmospheric CVD (SACVD) have been used. However, SACVD is sensitive to fill profile because SACVD is less than 100% conformal. Emerging flowable oxide processes provide liquid-like filling behavior but the film quality is largely limited by the high carbon content present in the film.

SUMMARY

A method for filling a trench in a substrate includes partially filling the trench with a first silicon dioxide layer. An amorphous silicon layer is deposited on the silicon dioxide layer. The trench is filled with a second silicon dioxide layer. An oxidation treatment is performed on the substrate to oxidize the amorphous silicon layer.

In other features, the trench comprises a shallow trench insulator (STI). The first silicon dioxide layer and the second silicon dioxide layer are deposited using an atomic layer deposition (ALD) process. The ALD process deposits conformal film. The ALD process uses process gases including Bis(tertiary-butyl-amino)silane (BTBAS), nitrous oxide ($N_2O$) and oxygen ($O_2$).

In other features, the oxidation treatment includes heating the substrate to a process temperature and exposing the substrate to water vapor. The oxidation treatment includes heating the substrate to a process temperature and exposing the substrate to molecular oxygen. The substrate is heated in a furnace. The process temperature is between 600° C. and 1000° C. The process temperature is between 875° C. and 925° C. The process time is between 1 hour and 5 hours. The trench has an aspect ratio that is greater than 4:1. The trench has an aspect ratio that is greater than 8:1.

In other features, the amorphous silicon layer is deposited using a thermal chemical vapor deposition (CVD) process. The thermal CVD process uses disilane as a process gas. The amorphous silicon layer has a thickness of 2 nm to 4 nm.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

Deposition of silicon dioxide ($SiO_2$) may be used to gap fill a trench of a substrate. However, a high wet etch rate seam remains at a center of the trench after merging of film on opposite sidewalls. In contrast to continuous deposition of $SiO_2$ film until the trench is fully filled, the systems and methods according to the present disclosure initially deposit $SiO_2$ to partially fill the trench and then deposit an amorphous silicon (a-Si) layer before the film on the opposite sidewalls meets. Afterwards, the $SiO_2$ deposition is resumed to fully fill the trench. The film stack is subsequently exposed to an oxidation treatment to convert the a-Si layer to $SiO_2$. The volume expansion induced during the oxidation treatment densifies the seam material.

Figure 1:
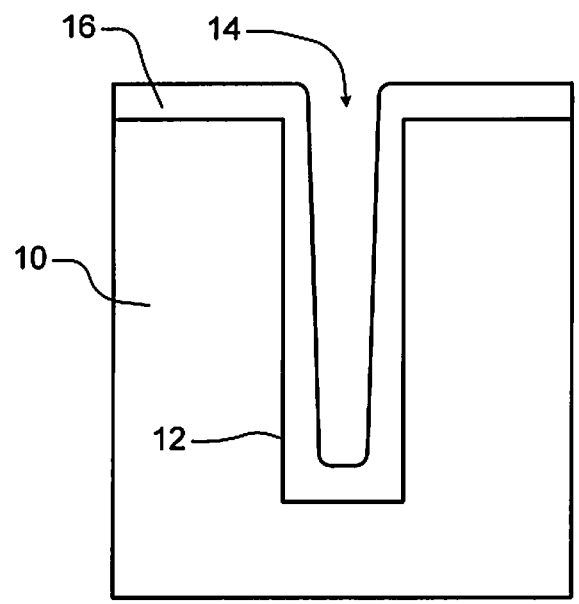
FIG. 1 is a side cross-sectional view of an example of a substrate including a trench that is partially filled by a silicon dioxide ($SiO_2$) layer according to the present disclosure.
Figure 2:
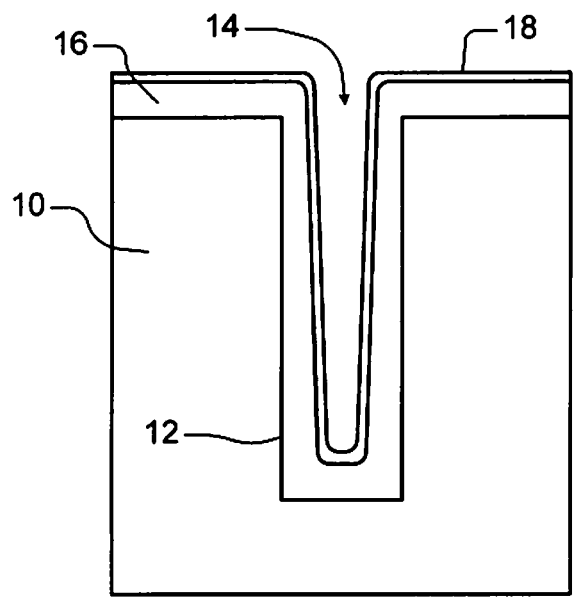
FIG. 2 is a side cross-sectional view of the substrate of FIG. 1 further including an amorphous silicon (a-Si) layer deposited on the $SiO_2$ in the trench according to the present disclosure.

Referring now to FIGS. 1 and 2, processing of a substrate 10 to fill a trench 12 with $SiO_2$ film is shown. In some examples, the trench 12 has a high aspect ratio (AR). In some examples, the AR is greater than 4:1. In other examples, the AR is greater than 8:1. In yet other examples, the AR is greater than 10:1. In some examples, the trench 12 is an STI trench.

In FIG. 1, a silicon dioxide ($SiO_2$) layer 16 is deposited in the trench 12 to partially fill the trench 12. In some examples, the $SiO_2$ layer 16 is deposited conformally. In some examples, the $SiO_2$ layer 16 is deposited using an ALD process.

In some examples, conformal ALD deposition of $SiO_2$ is performed in accordance with ALD processes described in commonly assigned U.S. Pat. No. 8,728,955 entitled "METHOD OF PLASMA ACTIVATED DEPOSITION OF A CONFORMAL FILM ON A SUBSTRATE SURFACE" and issued on May 20, 2014 to LaVoie et al., which is hereby incorporated by reference in its entirety. In some examples, the precursor gas includes Bis(tertiary-butyl-amino)silane (BTBAS), nitrous oxide ($N_2O$) and oxygen ($O_2$).

In FIG. 2, the substrate 10 of FIG. 1 is shown after an amorphous silicon (a-Si) layer 18 is deposited on the $SiO_2$ layer 16 in the trench 12. In some examples, the a-Si layer 18 has a thickness of 2-4 nm. In other examples, the a-Si layer 18 has a thickness of 3 nm. In some examples, the a-Si layer 18 is conformal.

In some examples, deposition of the a-Si layer 18 is performed using a thermal chemical vapor deposition (CVD) process or other suitable deposition process. In some examples, the deposition process for depositing the a-Si layer 18 uses disilane ($Si_2H_6$) as the precursor gas and the process temperature is 400° C.-600° C. In other examples, the process temperature is 450° C.-550° C. In still other examples, the process temperature is 500° C. In other examples, the a-Si layer 18 is deposited using ALD. For example only, ALD processes that are used to deposit conformal oxide, nitride or carbide layers may be used.

Figure 3:
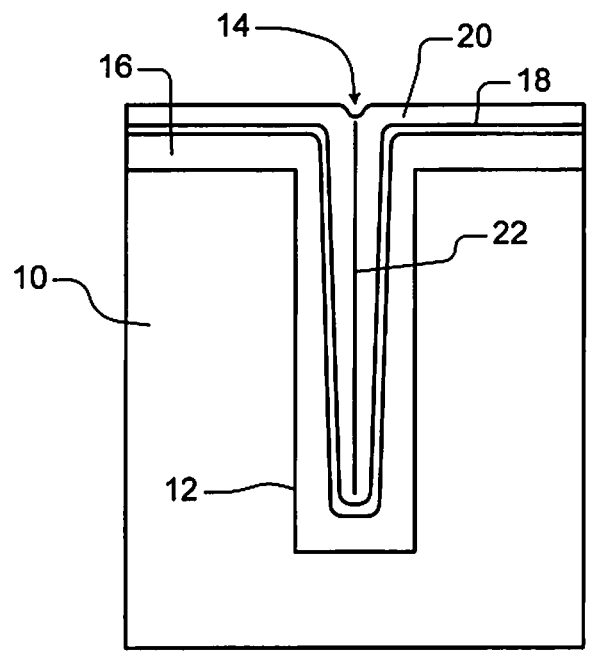
FIG. 3 is a side cross-sectional view of the substrate of FIG. 2 further including additional $SiO_2$ layer that fills in the trench and creates a seam according to the present disclosure.
Figure 4:
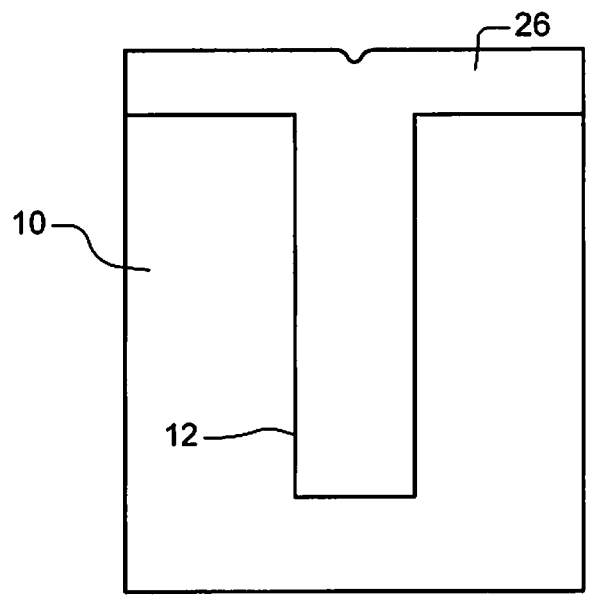
FIG. 4 is a side cross-sectional view of the substrate of FIG. 3 after removal of the seam using an oxidation step according to the present disclosure.

Referring now to FIGS. 3 and 4, additional processing of the substrate 10 is shown. In FIG. 3, the substrate 10 is shown after sidewalls of the $SiO_2$ layer 20 meet filling in the trench 12 and creating a seam 22. In some examples, the $SiO_2$ layer 20 is also deposited using a conformal process. In some examples, the $SiO_2$ layer 20 is deposited using an ALD process.

In FIG. 4, an oxidation treatment step is used to remove the seam 22. In some examples, the process to oxidize the a-Si layer includes heating the substrate in a furnace or other device to a process temperature. In some examples, the process temperature is between of 600° C. to 1000° C. In some examples, wet oxidation treatment with water vapor is used. In some examples, molecular oxygen, ozone, or carbon dioxide ($CO_2$) are used. In other examples, the process temperature is approximately 900° (e.g. between of 875° C. to 925° C.). In some examples, the process time is between 1 hour and 5 hours, although other process times may be used. In some examples, oxygen diffuses through the $SiO_2$ layer to the a-Si layer to at least partially convert the a-Si layer to $SiO_2$. Use of wet oxidation may reduce the process time since the water vapor has increased solubility into the $SiO_2$ layer.

In other examples, the oxidation step is performed in a processing chamber that generates an oxidant-containing plasma. The plasma systems may generate the plasma in-chamber or remotely. In other examples, the plasma systems may use radio frequency (RE), microwave (MW) and DC plasma power sources. In other examples, the plasma is generated by an inductively coupled plasma (ICP) system, a capacitively coupled plasma (CCP) system, or any other suitable plasma generating system. In some examples, the oxidation step may be performed using ultraviolet (UV) light and ozone. In still other examples, rapid thermal oxidation systems may be used to perform the oxidation step.

Figure 5:
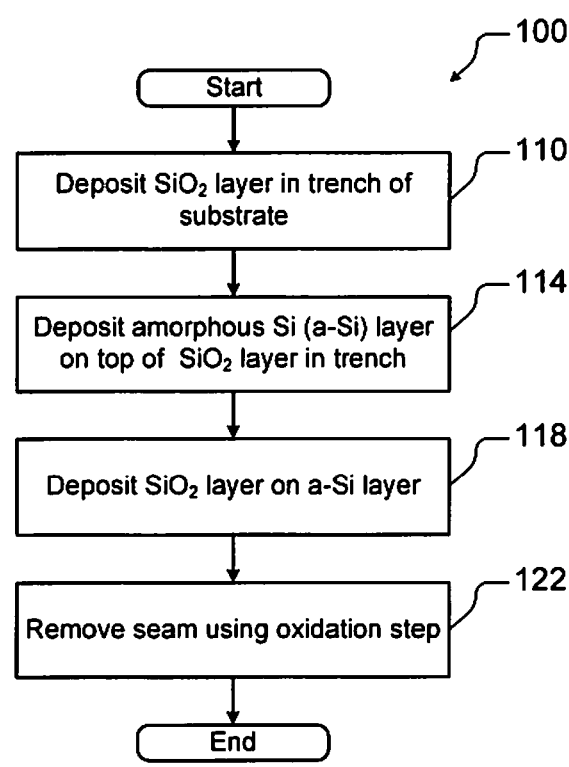
FIG. 5 is an example of a method for performing gap fill of a trench using $SiO_2$ layer, deposition of an amorphous silicon layer, deposition of a $SiO_2$ layer, and an oxidation step according to the present disclosure.

Referring now to FIG. 5, an example of a method 100 for performing gap fill of a trench is shown. At 110, a first $SiO_2$ layer is deposited in the trench of the substrate to partially fill the trench.

At 114, an amorphous silicon (a-Si) layer is deposited on the first $SiO_2$ layer. The a-Si layer partially fills the trench. At 118, a second $SiO_2$ layer is deposited on the a-Si layer. The trench is filled and a seam is created by the second $SiO_2$ layer. At 122, the seam is removed using an oxidation treatment step.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

What is claimed is:

1. A method for filling a trench in a substrate, comprising:
   partially filling the trench with a first silicon dioxide layer;
   depositing an amorphous silicon layer on the silicon dioxide layer;
   filling the trench by depositing a second silicon dioxide layer directly on the amorphous silicon layer using an atomic layer deposition process; and
   performing an oxidation treatment on the substrate to oxidize the amorphous silicon layer.

2. The method of claim 1, wherein the trench comprises a shallow trench insulator (STI).

3. The method of claim 1, wherein the first silicon dioxide layer is deposited using the ALD process.

4. The method of claim 3, wherein the ALD process deposits conformal film.

5. The method of claim 3, wherein the ALD process uses process gases including Bis(tertiary-butyl-amino)silane (BTBAS), nitrous oxide ($N_2O$) and oxygen ($O_2$).

6. The method of claim 1, where the oxidation treatment includes:
   heating the substrate to a process temperature; and
   exposing the substrate to water vapor.

7. The method of claim 1, where the oxidation treatment includes:
   heating the substrate to a process temperature; and
   exposing the substrate to molecular oxygen.

8. The method of claim 6, wherein the substrate is heated in a furnace.

9. The method of claim 6, wherein the process temperature is between 600° C. and 1000° C.

10. The method of claim 6, wherein the process temperature is between 875° C. and 925° C.

11. The method of claim 6, wherein the process time is between 1 hour and 5 hours.

12. The method of claim 1, wherein the trench has an aspect ratio that is greater than 4:1.

13. The method of claim 1, wherein the trench has an aspect ratio that is greater than 8:1.

14. The method of claim 1, wherein the amorphous silicon layer is deposited using thermal chemical vapor deposition (CVD) process.

15. The method of claim 14, wherein the thermal CVD process uses disilane as a process gas.

16. The method of claim 1, wherein the amorphous silicon layer has a thickness of 2 nm to 4 nm.

* * * * *